(12) United States Patent
Ogasawara et al.

(10) Patent No.: US 7,411,384 B2
(45) Date of Patent: Aug. 12, 2008

(54) WAFER CHUCK

(75) Inventors: Ikuo Ogasawara, Nirasaki (JP); Yoshiyasu Kato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/682,703

(22) Filed: Mar. 6, 2007

(65) Prior Publication Data

US 2007/0152691 A1    Jul. 5, 2007

Related U.S. Application Data

(63) Continuation of application No. PCT/JP2005/016234, filed on Sep. 5, 2005.

(30) Foreign Application Priority Data

Sep. 6, 2004  (JP) .............................. 2004-258955

(51) Int. Cl.
*G01R 31/28* (2006.01)
*G01R 31/02* (2006.01)
(52) U.S. Cl. .................... 324/158.1; 324/758
(58) Field of Classification Search ............. 324/158.1, 324/758; 33/286, 533, 645; 414/777, 816; 279/126, 133–135, 158
See application file for complete search history.

(56) References Cited

U.S. PATENT DOCUMENTS

| 5,605,844 | A | 2/1997 | Oki et al. | |
| 6,485,248 | B1 | 11/2002 | Taylor, Jr. | |
| 6,612,021 | B1 * | 9/2003 | Taniguchi et al. | 29/748 |
| 2003/0160401 | A1 * | 8/2003 | Kang et al. | 279/133 |
| 2005/0142815 | A1 * | 6/2005 | Miyazaki et al. | 438/464 |

FOREIGN PATENT DOCUMENTS

| EP | 1 197 988 A2 | 4/2002 |
| JP | 53-78173 | 7/1978 |
| JP | 7-302830 | 11/1995 |
| JP | 8-330372 | 12/1996 |
| JP | 11-238770 | 8/1999 |
| JP | 2002-198418 | 7/2002 |
| JP | 2003-66109 | 3/2003 |

OTHER PUBLICATIONS

"virtually." The American Heritage® Dictionary of the English Language, Fourth Edition. Houghton Mifflin Company, 2004. Jun. 27, 2007. <Dictionary.com http://dictionary.reference.com/browse/virtually>.*

* cited by examiner

*Primary Examiner*—Ha Nguyen
*Assistant Examiner*—Joshua Benitez
(74) *Attorney, Agent, or Firm*—Oblon, Spivak, McClelland, Maier & Neustadt, P.C.

(57) ABSTRACT

A wafer chuck is provided with a plurality of pins which protrude and retreat in a plurality of through holes formed in a vertical direction on a mounting table, and an ascending/descending mechanism for ascending and descending the pins. The wafer chuck receives a wafer by protruding the pins from the mounting plane of the mounting table. On each upper end surface of the pin, a receiving surface part is provided for substantially not making a gap between the pin and each of the corresponding through holes and a mechanism for aligning the receiving surface part with the mounting surface is provided.

10 Claims, 3 Drawing Sheets

WAFER CHUCK

This application is a Continuation Application of PCT International Application No. PCT/JP2005/016234 filed on 5 Sep. 2005, which designated the United States.

FIELD OF THE INVENTION

The present invention relates to a wafer chuck; and, more particularly, to a wafer chuck suitable for semiconductor manufacturing apparatuses such as a probe apparatus and the like.

BACKGROUND OF THE INVENTION

Most of the semiconductor manufacturing apparatuses are provided with a wafer chuck for holding thereon a wafer. Further, various processes are performed while the wafer is being held on the wafer chuck.

As shown in FIGS. 2A and 2B, a wafer chuck includes a mounting table 1 for mounting thereon a wafer W and capable of rotating in forward and backward directions; a plurality of (e.g., three) pins which protrude and retreat with respect to a mounting surface 1A of the mounting table 1; a substantially ring-shaped joint 3 for connecting the pins 2; cam followers 4A protruded radially outwards from a plurality of locations of the joint 3; cams 4B positioned under the cam followers 4A to be engaged therewith; and first biasing mechanisms 5 for constantly biasing the pins 2 downward. Each of the first biasing mechanisms 5 has a coil spring 5A and an axis 5B elongated downwards from a bottom surface of the mounting table to pass through the coil spring 5A.

As the mounting table 1 rotates in forward and backward directions, the cam followers 4A rotate along the cams 4B. Accordingly, the pins 2, in cooperation with the first biasing mechanisms 5, move (up and down) in an axial direction via through holes 1B formed in the mounting table 1, enabling the wafer W to be delivered and received above the mounting table 1.

Such wafer chuck can be used under the vacuum environment or the atmospheric pressure environment.

Among wafer chucks, there is the one delivering and receiving a diced wafer W by using a dicing frame DF, as shown in FIG. 3.

The dicing frame DF is used for dicing the wafer W into multiple chips T. As partially enlarged in FIG. 4B, the diced wafer W is completely separated as the chips T and supported by the dicing frame DF via a film F having thereon notched grooves.

In the wafer chuck of FIG. 3 for use in, e.g., a probe apparatus, for testing the wafer W, a plurality of rods 6A of cylinder mechanisms 6 are raised to a position indicated by a dashed dotted line and, then, the diced wafer W accommodated on the dicing frame DF is received from a transfer mechanism of the probe apparatus by a plurality of receiving parts 6B provided at leading ends of the rods 6A. Further, while the receiving parts 6B are returning to fixed blocks 6C provided below the mounting table 1A, the dicing frame DF and the wafer W are mounted on the mounting table 1A, as indicated by a dashed dotted line of FIG. 3. After the receiving parts 6B reach supports 6D protruded from the fixed blocks 6C, frame parts of the dicing frame DF which tend to fall by gravity are adsorptively held by the supports 6D. In such a state, an electrical characteristic test is performed on each of the chips T of the wafer W mounted on the mounting table 1A.

However, when the diced wafer is mounted by using a dicing frame DF on the mounting table 1 of the wafer chuck of FIGS. 2A and 2B used for an undiced wafer, the pins 2 are lowered from a position indicated by a dashed dotted line of FIG. 4A to a position indicated by a solid line of FIG. 4A and then retreated into the through holes 1B of the mounting table 1, as illustrated in FIGS. 4A and 4B. At this time, gaps are formed between leading ends of the pins 2 and the film F supporting the wafer W, thereby generating recess portions on the mounting table 1. Due to the presence of the recess portions, the chips T positioned on the through holes 1B may be damaged when a stylus pressure of a probe for the electrical characteristic test is applied to the corresponding chips T. Moreover, in case each of the chips T is scaled-down along with a trend toward a high integration of a wiring structure or the like, an area of a chip T may be smaller than that of a through hole 1B, as illustrated in FIG. 4B. In that case, it is not possible to apply the stylus pressure of the probe required for the test on the chips T disposed on the through holes 1B, so that the electrical characteristic test may not be carried out.

SUMMARY OF THE INVENTION

The present invention has been developed to effectively solve the aforementioned drawbacks. It is, therefore, an object of the present invention to provide a wafer chuck capable of mounting thereon a wafer despite whether it is diced or not and also capable of performing processes such as an electrical characteristic test and the like without being hindered by through holes via which wafer exchanging pins move up and down.

In accordance with a first aspect of the invention, there is provided A wafer chuck including: a plurality of pins which protrude and retreat in a plurality of through holes formed in a vertical direction on a mounting table; an ascending/descending mechanism for ascending and descending the pins, the wafer chuck being configured to receive a wafer by protruding the pins from a mounting surface of the mounting table, wherein each of the pins has on an upper end surface thereof a receiving part for preventing a gap from being formed between the pin and each of the corresponding through holes; and an unit for aligning the receiving parts with the mounting surface.

In accordance with the first aspect of the present invention, when the wafer supported by a dicing frame via a film or the like is mounted on the mounting table, recess formation can be avoided in the through holes by aligning the receiving part to be flush with the mounting surface. Hence, processes such as a test and the like can be accurately performed.

In accordance with another aspect of the invention, there is provided A wafer chuck including: a plurality of pins which protrude and retreat in a plurality of through holes formed in a vertical direction on a mounting table; an ascending/descending mechanism for ascending and descending the pins; a plurality of cylinder mechanisms provided around the mounting table, each having a vertically moving receiving part, the wafer chuck being configured to deliver and receive a wafer by protruding the pins from a mounting surface of the mounting table, wherein each of the pins has on an upper end surface thereof a receiving part for preventing a gap from being formed between the pin and each of the corresponding through holes; and an unit for aligning the receiving parts with the mounting surface.

In accordance with a second aspect of the present invention, when the wafer supported by a dicing frame via a film or the like is mounted on the mounting table, recess formation can be also avoided in the through holes by aligning the receiving part to be flush with the mounting surface. Hence, processes such as a test and the like can be accurately performed.

It is preferable that the unit for aligning the receiving part with the mounting surface has a supported surface part formed under the receiving part of the pin, an supporting part to be contacted with the supported surface part in the through hole and a biasing mechanism for allowing a contact between the supported surface part and the supporting part.

Further, it is preferable that the supporting part is formed as a stepped portion having a more reduced diameter hole than a part accommodating therein the receiving part of the pin in the through hole.

Furthermore, it is preferable that an upside-down truncated cone shaped part is formed between the receiving part and the supported surface part in the pin.

DETAILED DESCRIPTION OF THE EMBODIMENT

Hereinafter, a first embodiment of the present invention will be described in detail with reference to the accompanying drawings.

Figure 1A:
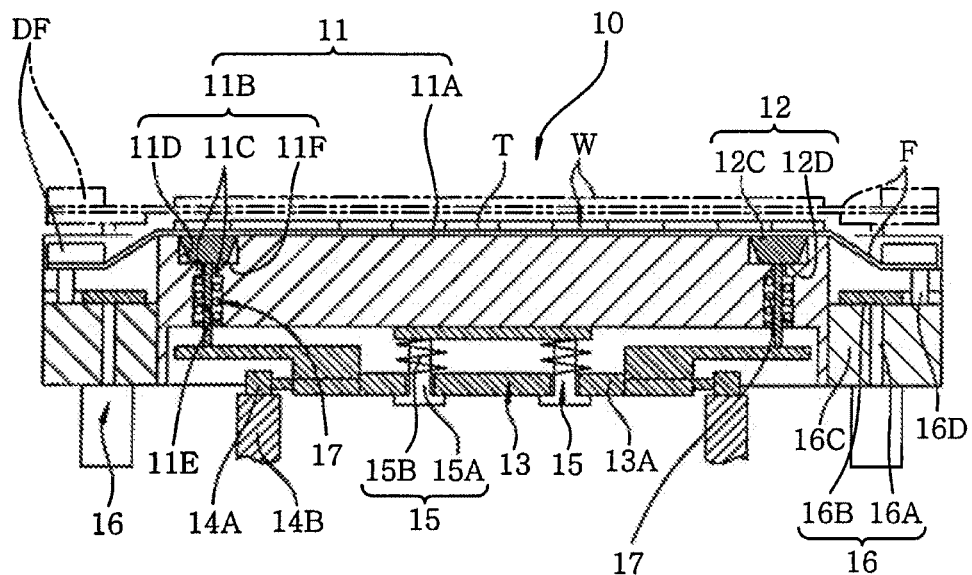
FIG. 1A is a cross sectional view of principal parts of a first embodiment of a wafer chuck of the present invention.
Figure 1B:
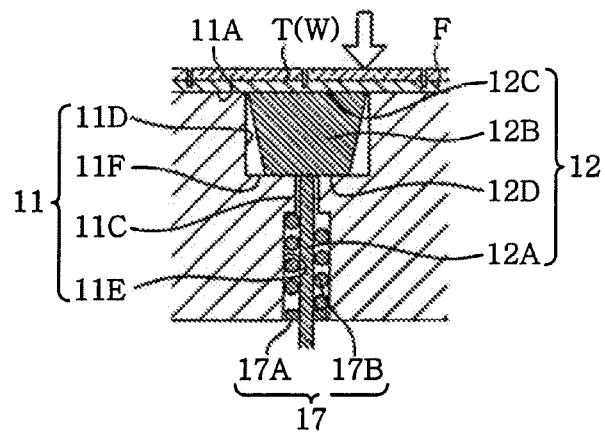
FIGS. 1B and 1C are enlarged cross sectional views showing a part of FIG. 1A.
Figure 1C:
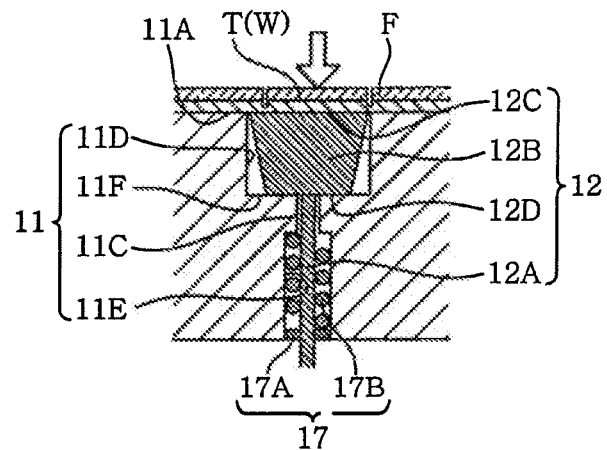
Figure 2A:
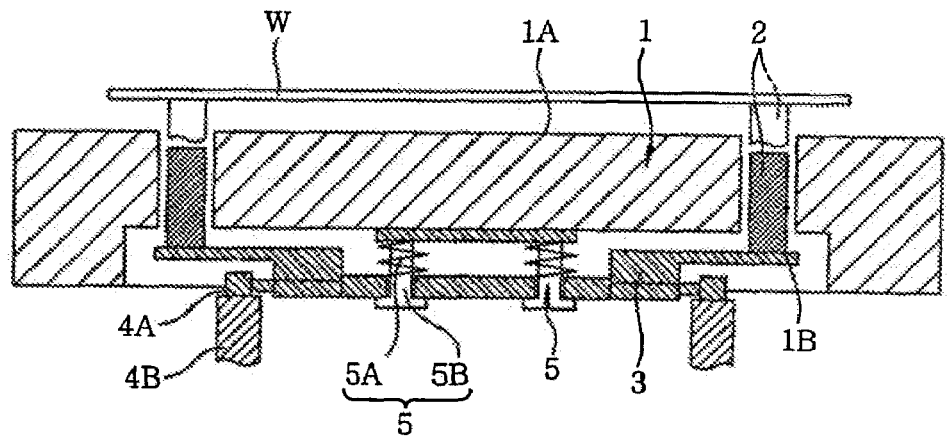
FIG. 2A provides a cross sectional view illustrating an exemplary conventional wafer chuck used for processing an undiced wafer, and FIG. 2B describes an enlarged side view of a part of FIG. 2A.
Figure 2B:
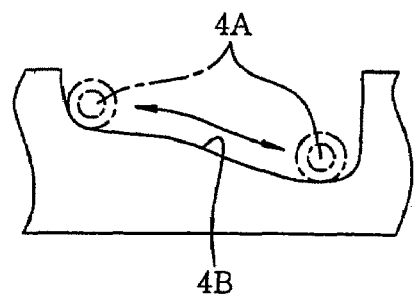
Figure 3:
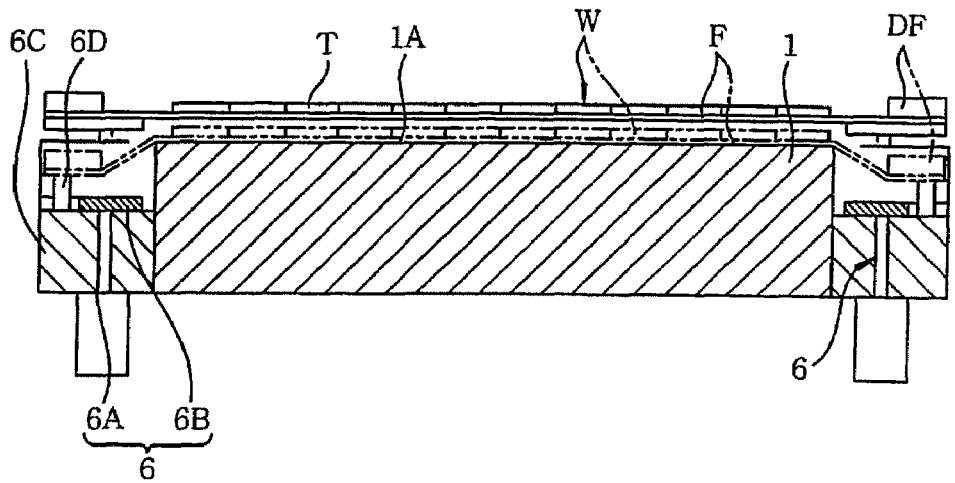
FIG. 3 presents a cross sectional view depicting an exemplary conventional wafer chuck used for processing a diced wafer.
Figure 4A:
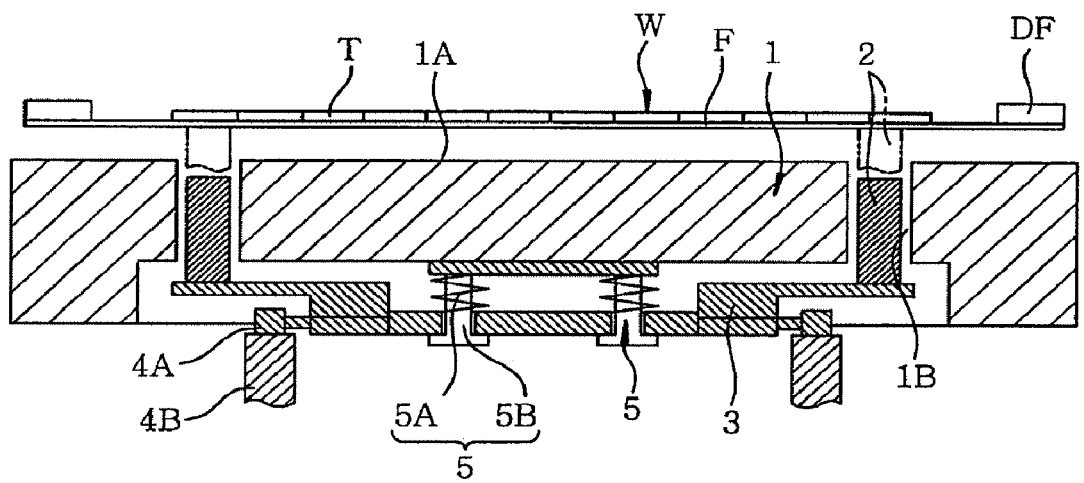
FIG. 4A represents a cross sectional view showing a state where the diced wafer is processed by using the wafer chuck of FIGS. 2A and 2B.
Figure 4B:
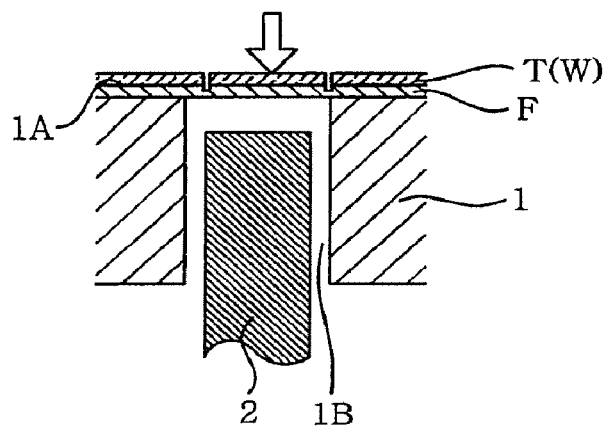
FIG. 4B illustrates an enlarged side view of a part of FIG. 4A.

FIG. 1A is a cross sectional view of principal parts of a first embodiment of a wafer chuck of the present invention, and FIGS. 1B and 1C are enlarged cross sectional views showing a part of FIG. 1A.

As shown in FIG. 1A, a wafer chuck 10 of this embodiment includes a mounting table 11 having a circular shape when seen from top, for mounting thereon an undiced wafer or a diced wafer W supported by dicing frame DF; a plurality of (e.g., three) pins 12 spaced from each other at regular intervals along a circumferential direction to protrude and retreat in through holes 11B with respect to a mounting surface 11A of the mounting table 11; a joint 13 for connecting the pins 12 as a unit; cam followers 14A protruded radially outwards from a plurality of locations of the joint 13; cams 14B positioned under the cam followers 14A to be engaged therewith, and first biasing mechanisms 15 for constantly biasing the pins 12 downward.

As the mounting table 11 rotates in forward and backward directions, the cam followers 14A rotate along the cams 14B. Accordingly, the pins 12, in cooperation with the first biasing mechanisms 15, move (up and down) in an axial direction via the through holes 11B formed in the mounting table 1, enabling the wafer W to be delivered and received above on the mounting table 11.

As illustrated in FIG. 1A, the first biasing mechanisms 15 have a plurality of vertical motion guide rods 15A elongated downwards from a bottom surface of the mounting table 11 to pass through a horizontal member 13A of the joint 13, the vertical motion guide rods 15A being provided near a center of an axis of the mounting table 11; and coil springs 15B elastically provided between the mounting table 11 and the horizontal member 13A to surround the vertical motion guide rods 15A. Accordingly, the first biasing mechanisms 15, in cooperation with cam mechanisms 14 including the cam followers 14A and the cams 14B, constantly bias the joint 13 and further the three pins 12 downward. Further, the vertical motion guide rods 15A have on their lower ends flanges for supporting the horizontal member 13A.

Further, as illustrated in FIG. 1A, the wafer chuck 10 is provided with a plurality of cylinder mechanisms 16 spaced from each other at regular intervals along an outer peripheral portion of the mounting table 11. The cylinder mechanisms 16 are configured to deliver and receive the dicing frame DF holding thereon the wafer W. In other words, as can be seen from FIG. 1A, each of the cylinder mechanisms 16 has a vertically movable rod 16A and an supported part (receiving part) 16B attached to an upper end of the rod 16A. The supported part 16B of this embodiment has a cutaway portion and is formed in a substantially one side opened rectangular shape when seen from top.

Also as shown in FIG. 1A, fixed blocks 16C are provided at the locations where the cylinder mechanisms 16 are arranged around the mounting table 11. Top surfaces of the fixed blocks 16C are positioned lower than the mounting surface 11A of the mounting table 11. Further, the rods 16A of the cylinder mechanisms 16 pass through the fixed blocks 16C. The supported parts 16B are supported by the top surfaces of the fixed blocks 16C with their cutaway portions facing an opposite side of the mounting table 11.

Further, installed uprightly on the top surfaces of the fixed blocks 16C are supports 16D each having a suction opening (not shown) connected with a suction port (not shown). The supports 16D are provided at locations corresponding to the cutaway portions of the supported parts 16B, so that the frame parts of the dicing frame DF can be adsorptively held via the suction openings while the supported parts 16B are being lowered to the fixed blocks 16C. In order to support the film F of the dicing frame DF with a tensile force applied thereto, the supports 16D are formed with a height at which the top surface of the dicing frame DF are supported at a height lower than the mounting surface 11A. A height difference between the top surface of the dicing frame DF supported by the supports 16D and the mounting surface 11A of the mounting table 11 is configured to be adjusted from a range of about 0 mm to about 2.5 mm.

Meanwhile, as described in FIGS. 1A to 1C, each of the pins 12 has an axis 12A elongated from the joint 13 in an upward vertical direction and a supported part (receiving surface part) 12B formed on an upper end of the axis 12A with a diameter greater than that of the axis 12A. The wafer W is delivered or received by supported parts 12B. The supported part 12B has a receiving surface 12C for receiving thereon the wafer W; and a supported surface 12D to be supported by a stepped surface having a reduced hole diameter in the through hole 11B as will be described later, the supported surface 12D being parallel to the receiving surface 12C. The supported part 12B has an upside-down truncated cone shape in which the receiving surface 12C is greater than the supported surface 12D in diameter.

As can be seen from FIGS. 1A and 1B, each of the through holes 11B through which the pins 12 move up and down has a neck part 11C, a cylindrical large-diameter part 11D formed above the neck part 11C and a cylindrical small-diameter part 11E formed under the neck part 11C. Further, a top surface of the neck part 11C is formed as a supporting part 11F to be contacted with the supported surface 12D of the pin 12.

Hereinafter, a relationship between the pin 12 and the through hole 11B will be described in detail. The receiving surface 12C of the pin 12 is formed with a diameter slightly smaller than that of the large-diameter part 11D of the through hole 11B, so that virtually no gap is generated between the receiving surface 12C and the large-diameter part 11D. Further, the supported surface 12D of the pin 12 is supported by the supporting part 11F having a diameter greater than an inner diameter of the neck part 11C of the through hole 11B. In other words, a descending movement of the pin 12 is restricted by the supporting part 11F. Moreover, an axial length of the large-diameter part 11D of the through hole 11B is substantially equal to a distance from the receiving surface 12C to the supported surface 12D of the pin 12. Therefore, when the pin 12 reaches a lower limit the supported part 12B is placed inside the large-diameter part 11D of the through hole 11B and, also, the receiving surface 12C is positioned on the same plane as the mounting surface 11A of the mounting table 11. In other words, the supporting part 11F of the through hole 11B and the supported surface 12D of the pin 12 have functions of aligning the receiving surface 12C to be flush with the mounting surface 11A and determining the lower limit of the pin 12.

As illustrated in FIGS. 1A to 1C, the axis 12A of each of the pins 12 is provided with a second biasing mechanism 17. The second biasing mechanism 17 constantly biases the corresponding pin 12 downward, thereby constantly aligning the receiving surface 12C of the pin 12 to be flush with the mounting surface 11A of the mounting table 11 on the same plane.

The second biasing mechanism 17 of this embodiment includes a stopper ring 17A fixed to the axis 12A of the pin 12 with a diameter slightly smaller than that of the small-diameter part 11E of the through hole 11B; and a coil spring 17B elastically provided between the stopper ring 17A and the neck part 11C of the through hole 11B. The coil spring 17B biases the supported part 12B of the pin 12 downward and, thus, the supported surface 12D is pressed to the supporting part 11F. Accordingly, even when each of the receiving surfaces 12C are partially protruded from the mounting surface 11A by the pins 12 deviated from the horizontal position due to the operation of the first biasing mechanisms 15, the second biasing mechanisms 17 allow the supported parts 12B of the pins 12 to be firmly pressed to the supporting parts 11F of the through holes 11B, so that the receiving surfaces 12C of the pins 12 can be securely flush with the mounting surface 11A.

Hereinafter, an operation of the wafer chuck 10 will be described. When a diced wafer W is transferred by a transfer mechanism (not shown) while being held by the dicing frame DF, the cylinder mechanisms 16 operate. The operation of the cylinder mechanisms 16 leads to a moving-up of the supported parts 16B. The supported parts 16B receive the dicing frame DF in their uppermost raised positions indicated by a dashed dotted line of FIG. 1A. Next, the cylinder mechanisms 16 operate reversely and, thus, the supported parts 16B return to top surfaces of the fixed blocks 16C which are lower than the mounting surface 11A of the mounting table 11. During the returning process, the wafer W held by the dicing frame DF is mounted on the mounting table 11. Further, the frame parts of the dicing frame DF which tend to fall by gravity are adsorptively held by the supports 16D. In such a state, a tensile force is applied to the film F of the dicing frame DF.

When the wafer chuck 10 receives the wafer W and then moves in a horizontal direction, the wafer W and a probe (not shown) are position-aligned. Next, the mounting table 11 is raised, so that an electrode pads of the wafer are contacted with the probe. To be specific, a specific stylus pressure is applied to the wafer W, as indicated by an arrow in FIG. 1B. At this time, the electrode pads and the probe are electrically connected and, thus, a required electrical characteristic test can be performed.

Even when a size of the diced chips T is greater than that of the through hole 11B of the wafer chuck 10, the chip T may be disposed on both of the mounting surface 11A and the through hole 11B, as shown in FIG. 1B. In such a case, since the chip T is received on the receiving surface 12C of the pin 12 in the through hole 11B and, also, the supported surface 12D of the pin 12 is supported by the supporting part 11F in the through hole 11B, the pin 12 can not be forced to move downward and the chip T can be securely tested, even if the stylus pressure indicated by the arrow of FIG. 1B is equal to that in the mounting surface 11A. In other words, the test of the chips T is not hindered by the through holes 11B.

Moreover, even if a size of the chip T is smaller than that of an opening of the through hole 11B and the corresponding chip T is all positioned inside the through hole 11B as shown in FIG. 1A and, also the stylus pressure in the through hole 11B, which is indicated by the arrow of FIG. 1C, is equal to that in the mounting surface 11A, the chip T is received on the receiving surface 12C of the pin 12 in the through hole 11B which is positioned on the same plane as the mounting surface 11A. Therefore, the pin 12 can not be forced to move downward and the chip T can be securely tested. In other words, the test of the chips T is not hindered by the through holes 11B.

As described above, in accordance with this embodiment, the receiving surfaces 12C virtually not making gaps with respect to their corresponding through holes 11B are formed at the top end of the pins 12, and an aligning mechanism for aligning the receiving surfaces 12C to be flush with the mounting surface 11A of the mounting table 11 is provided. Thus, the diced chips T supported by the dicing frame DF as well as a conventional wafer can be properly processed or tested without being hindered by the presence of the through holes 11B.

Further, in accordance with the embodiment, the aligning mechanism for aligning the receiving surface 12C of the pin 12 to be flush with the mounting surface 11A of the mounting table 11 includes the supported surface 12D of the pins 12 formed under the receiving surface 12C; an supporting part 11F of the through hole 11B to be contacted (or engaged) with the supported surface 12D; and a second biasing mechanism 17 for allowing the contact (or engagement) between the supported surface 12D and the supporting part 11F. Accordingly, even when an external force such as a stylus pressure or the like is applied to the chips T positioned on the through holes 11B, the pins 12 are stopped by the supporting part 11F via the supported surface 12D of the exchanging parts 12B. As a result, the pins 12 can not be lowered below the top of the through holes 11B downwardly. That is, the receiving surfaces 12C are flush with the mounting surface 11A on the same plane and thus the test of the chips T can be securely performed.

Further, in the through hole 11B, the supporting part 11F (and the neck part 11C) is formed of a stepped portion having a smaller diameter hole than the large-diameter part 11D accommodating therein the receiving surface 12C. This serves as a structure preventing the pins 12 from descending below the top of the through holes 11B and can be formed easily. Furthermore, the upper portion of the pin 12 including the receiving surface 12C and the supported surface 12D has an upside-down truncated cone shape. This structure can also be formed easily and serves to prevent the pins 12 from being forced to move downward as in the case of the structure of the through hole 11B.

In case of mounting an undiced wafer W, i.e., a wafer W which is not accompanied by the dicing frame DF, on the mounting table 11, the pins 12 and the cam mechanisms 14 can be used as in the prior art.

The present invention is not limited to the aforementioned embodiment and, further, each of the components thereof can be appropriately modified when necessary. Although the aforementioned embodiment has described the wafer chuck for supporting a wafer by using the dicing frame, the present invention can be applied to a wafer chuck for supporting only a wafer as well.

While the invention has been shown and described with respect to the embodiments, it will be understood by those skilled in the art that various changes and modification may be made without departing from the scope of the invention as defined in the following claims.

What is claimed is:

1. A wafer chuck comprising:
a plurality of pins, each of which protrudes and retreats via a through hole formed in a vertical direction in a mounting table, each of the pins including at a top end thereof a receiving surface part which virtually makes no gap between each of the pins and the through hole;
a joint member for supporting the pins;
an ascending/descending mechanism for ascending and descending the joint member to thereby protrude and retreat the pins, the wafer chuck being configured to receive or deliver a wafer by protruding the pins above a mounting surface of the mounting table; and
a mechanism for aligning the receiving surface part of each of the pins to be flush with the mounting surface, wherein the mechanism includes a supported surface part formed below the receiving surface part of each of the pins, a supporting part formed in the through hole to be contacted with the supported surface part, and a pressing arrangement for making the supported surface part constantly contact the supporting part, and
wherein the pressing arrangement includes a first pressing mechanism for biasing the joint member, and a second pressing mechanism provided at each of the pins for biasing each of the pins.

2. The wafer chuck of claim 1, wherein the supporting part is formed of a stepped portion having a hole with a smaller diameter than that of an adjacent portion of the through hole, the stepped portion being provided to accommodate therein the receiving surface part of each of the pins.

3. The wafer chuck of claim 1, wherein a part of each of the pins between the receiving surface part and the supported surface part has an upside-down truncated cone shape.

4. The wafer chuck of claim 1, wherein each of the pins has a stopper ring fixed to an axis thereof, and the second pressing mechanism is adapted to press the stopper ring downwards.

5. The wafer chuck of claim 1, wherein the second pressing mechanism is formed of a coil spring elastically provided in the through hole.

6. A wafer chuck comprising:
a plurality of pins, each of which protrudes and retreats via a through hole formed in a vertical direction in a mounting table, each of the pins including at a top end thereof a receiving surface part which virtually makes no gap between each of the pins and the through hole;
a joint member for supporting the pins;
an ascending/descending mechanism for ascending and descending the joint member to thereby protrude and retreat the pins;
a mechanism for aligning the receiving surface part to be flush with the mounting surface, wherein the mechanism includes a supported surface part formed below the receiving surface part of each of the pins, a supporting part formed in the through hole to be contacted with the supported surface part, and a pressing arrangement for making the supported surface part constantly contact the supporting part; and
a number of cylinder mechanisms provided around the mounting table, each cylinder mechanism including a vertically moving receiving part, and the wafer chuck being configured to deliver and receive a wafer supported by a dicing frame by protruding the receiving part above the mounting surface of the mounting table, and
wherein the pressing arrangement includes a first pressing mechanism for biasing the joint member, and a second pressing mechanism formed at each of the pins for biasing each of the pins.

7. The wafer chuck of claim 6, wherein the supporting part is formed of a stepped portion having a hole with a smaller diameter than that of an adjacent portion of the through hole, the stepped portion being provided to accommodate therein the receiving surface part of each of the pins.

8. The wafer chuck of claim 6, wherein a part of each of the pins between the receiving surface part and the supported surface part has an upside-down truncated cone shape.

9. The wafer chuck of claim 6, wherein each of the pins has a stopper ring fixed to an axis thereof, and the second pressing mechanism is adapted to press the stopper ring downwards.

10. The wafer chuck of claim 6, wherein the second pressing mechanism is formed of a coil spring elastically provided in the through hole.

* * * * *